United States Patent [19]

St. Onge

[11] Patent Number: 5,214,374
[45] Date of Patent: May 25, 1993

[54] DUAL LEVEL TEST FIXTURE

[75] Inventor: Gary F. St. Onge, Ballston Lake, N.Y.

[73] Assignee: Everett/Charles Contact Products, Inc., Pomona, Calif.

[21] Appl. No.: 806,169

[22] Filed: Dec. 12, 1991

[51] Int. Cl.$^5$ .................. G01R 15/12; G01R 31/22
[52] U.S. Cl. .................... 324/158 F; 324/158 P; 439/482
[58] Field of Search ........... 324/158 P, 158 F, 72.5; 439/482; 269/134, 21, 20

[56] References Cited

U.S. PATENT DOCUMENTS

| | | | |
|---|---|---|---|
| 4,344,033 | 8/1982 | Stowers et al. | 324/158 P |
| 4,626,776 | 12/1986 | Wilkinson | 324/158 P |
| 4,626,779 | 12/1986 | Boyle | 324/158 P |

Primary Examiner—Vinh Nguyen
Attorney, Agent, or Firm—Christie, Parker & Hale

[57] ABSTRACT

A test fixture with a single vacuum well and two vacuum chambers for use in the automatic testing of printed circuit boards is connected to an electronic circuit tester for performing high speed testing of circuits on the board. The fixture includes a vacuum well, two vacuum chambers formed by gaskets, a movable top plate for moving the circuit board and a stripper plate between two positions, and ar array of test probes disposed in the vacuum well for access to the circuit board. The board under test is placed on the test fixture and a first vacuum is drawn from the first vacuum chamber to move the plate, thereby engaging a first plurality of test probes with the board for performing functional tests. A second vacuum is drawn from the second vacuum chamber to move the printed circuit board to engage a second set of test probes. A second set of electrical test signals is communicated to both sets of test probes for a second in-circuit test.

15 Claims, 5 Drawing Sheets

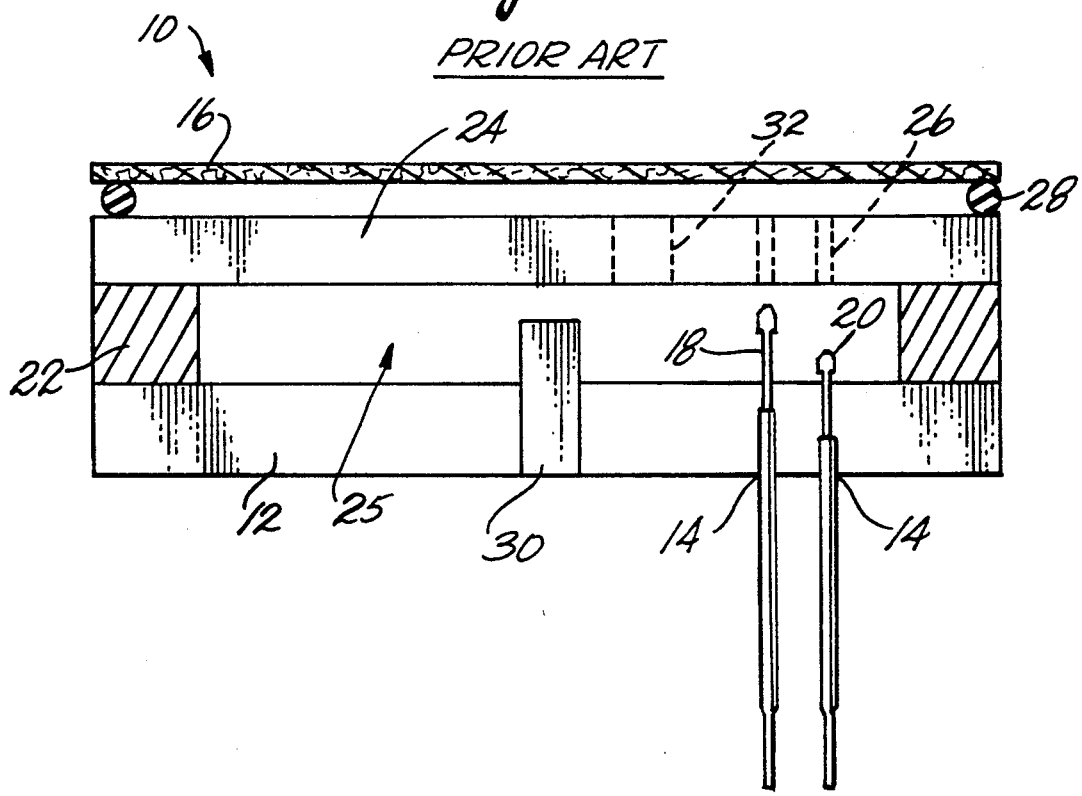

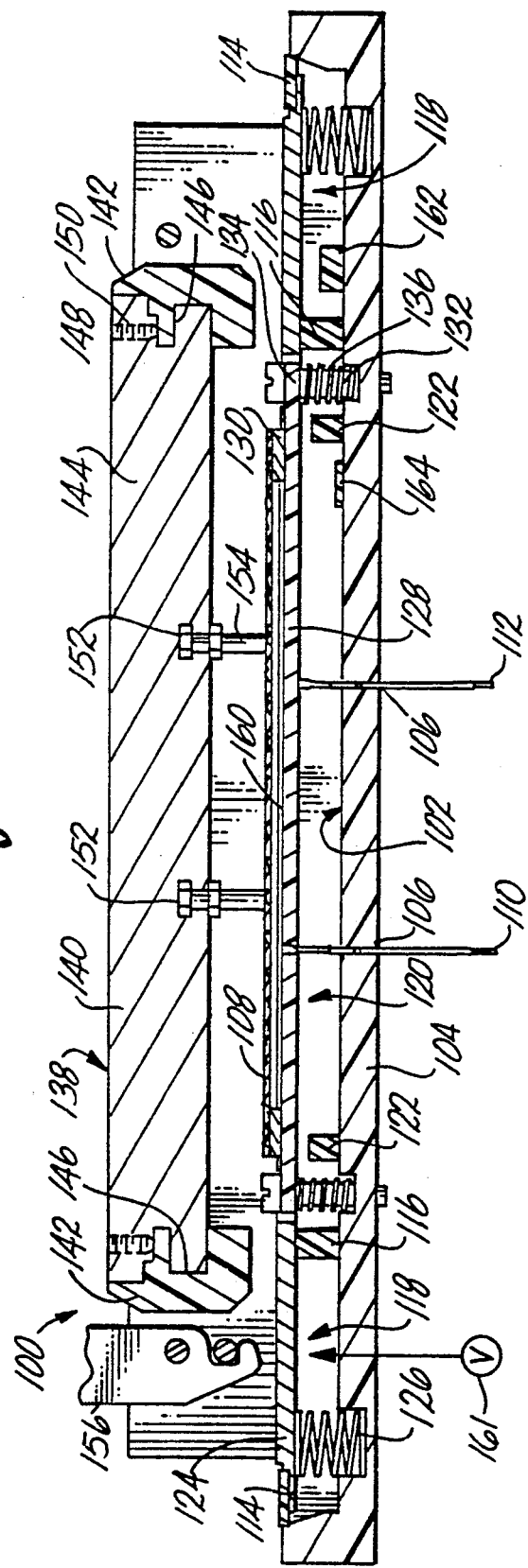

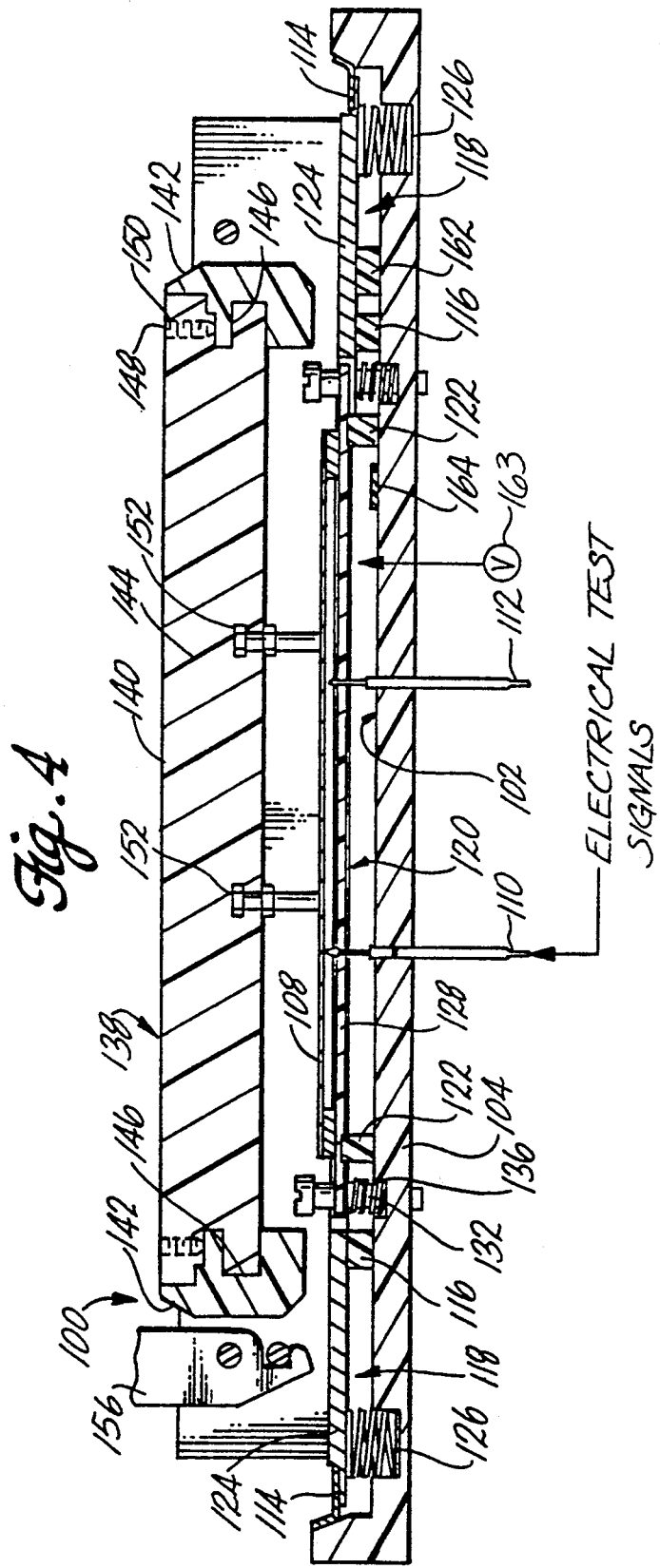

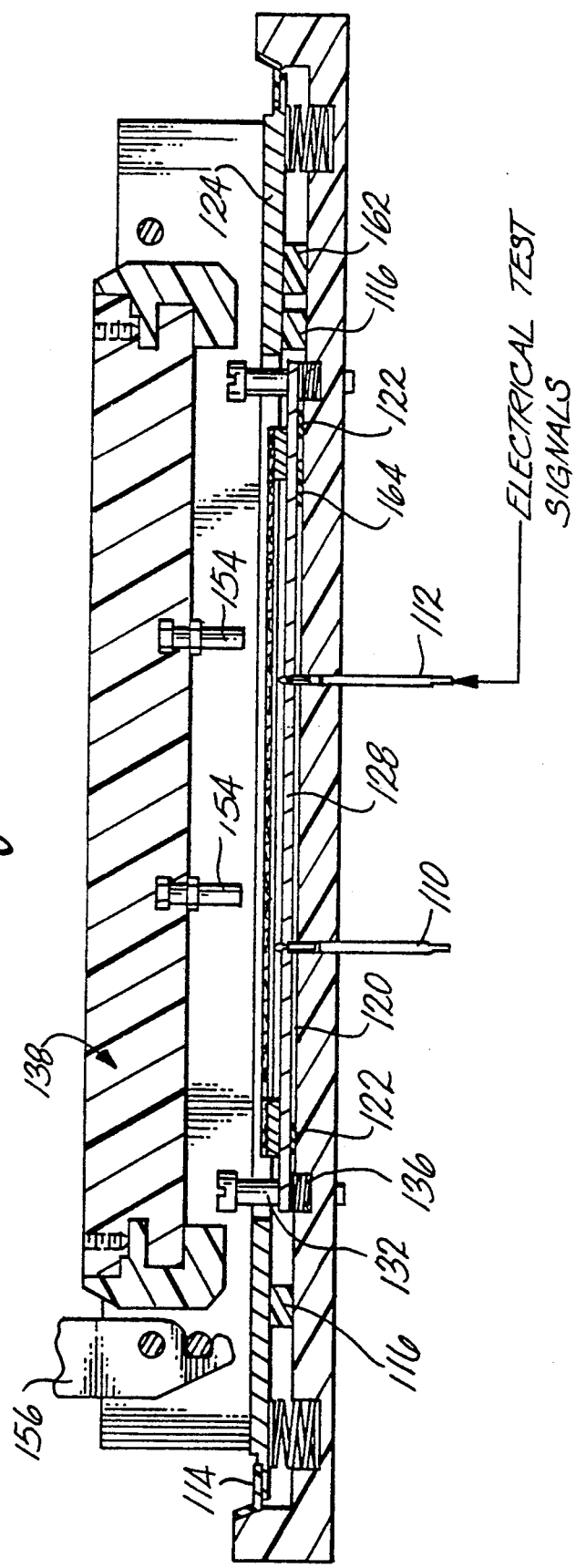

DUAL LEVEL TEST FIXTURE

FIELD OF THE INVENTION

This invention relates to the automatic testing of printed circuit boards, and more particularly, to a vacuum test fixture having a single vacuum well divided into two air chambers for holding the circuit board under test at two different positions for contact with two different sets of test probes.

BACKGROUND OF THE INVENTION

Automatic test equipment for checking printed circuit boards has long involved use of a "bed of nails" test fixture to which the circuit board is mounted during testing. This test fixture includes a large number of nail-like spring loaded test probes arranged to make electrical contact under spring pressure with designated test points on the circuit board under test. Any particular circuit laid out on a printed circuit board is likely to be different from other circuits and consequently the "bed of nails" arrangement for contacting test points in a particular circuit board must be customized for that circuit board. When the circuit to be tested is designed, a pattern of test points to be used in checking it is selected and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture, superimposed on the array of test probes. During testing, spring loaded test probes are brought into spring pressure contact with the test points on the circuit board under test. Electrical test signals are then transferred from the board to the test probes and then to the exterior of the fixture for communication with a high speed electronic test analyzer which detects continuity, or lack of continuity, between various test points and the circuits on the board.

Some test applications require a different set of test points to be monitored during different tests. For example, in-circuit and functional testing require a different set of test points for each test. Functional testing applies electrical test signals to the input terminals of the circuit board and detects test signals on the output terminals of the circuit board. On the other hand, in-circuit testing applies and detects electrical test signals on test points located throughout the circuit board. Means for selecting different test points are required.

Various fixtures have been used in the past for performing both functional and in-circuit testing. One class of these fixtures sets the functional probes at a higher level in the fixture than the in-circuit probes. The printed circuit board is moved to engage the functional probes and not the in-circuit probes. After the functional test is completed, the printed circuit board is moved to engage the in-circuit probes. The circuit board under test is attached to a moving top plate, which moves down when a vacuum is drawn from a chamber below the top plate until stopped by a movable pin. In this stopped position, the circuit board contacts the functional test probes, but not the in-circuit probes. After functional testing is completed, the vacuum is released. As the fluid pressure in the vacuum chamber increases, the top plate moves up and away from the movable pin and disengages contact between the functional probes and the circuit board. The movable pin is then moved laterally to align it with a clearance hole in the top plate so that, when the vacuum is drawn during the in-circuit test, the movable pin moves into the clearance hole as the top plate moves down. Because the top plate is not stopped by the movable pin, the circuit board is free to move down to contact both the functional and the in-circuit test probes. This fixture requires the release of both vacuum and power when changing stages between functional and in-circuit testing. This release increases the cost of testing since test time is increased. The release of vacuum and power also has the disadvantage that, during troubleshooting of circuit boards that are failing functional tests, a failure occurring during functional testing may not reoccur during in-circuit testing after power is reapplied to the circuit board. The moving top plate and the probe plate are also susceptible to significant bowing from the moment force created by the atmospheric pressure on the circuit board that deflects the board around the movable pin which acts as a fulcrum for the moment force.

A second class of test fixtures places the circuit board in contact with both the in-circuit and the functional test probes simultaneously during in-circuit and functional testing. However, for this class, the in-circuit test probe differs from the functional test probe. A gap exists within the in-circuit probe that breaks electrical continuity from the circuit board to the test analyzer during functional testing. Electrical continuity is achieved during ir-circuit testing by closing the gap. In this fixture two vacuums are used for moving the top plate and the circuit board. The first vacuum draws the circuit board into spring contact with both probes but does not close the gap in the in-circuit test probe. In order to perform the in-circuit test, the second vacuum is drawn which further moves the top plate and the circuit board to close the gap in the in-circuit probe, thereby allowing test signals to be communicated from both the in-circuit and the functional test probes to the circuit board under test. This fixture has several disadvantages. First, all top level probes engage the circuit board during functional test. The upper portion of the in-circuit probe can act as an antenna which picks up stray signals and also as a capacitive load on the circuits on the circuit board. Second, two vacuum wells are required which add to the cost and complexity of the test fixture. Third, extra probes, additional drilling of holes, and additional parts are required, all of which increase the cost of the test fixture. Fourth, special probes must be used to provide the gap for the in-circuit probes, along with special receptacles for holding the probes in the vacuum wells. Finally, the use of special probes limits the dimensions of the spacing between test points, thereby precluding use of this style of fixture for new circuit board technology. As circuit board technology advances, circuit components are more closely spaced. The test points and probes for such circuits necessarily must be more closely spaced, requiring smaller probes and springs, which become more difficult and expensive to make.

SUMMARY OF THE INVENTION

Briefly, this invention provides a circuit board testing fixture which moves a circuit board to two different testing positions for engaging two different sets of test probes. In a preferred embodiment of the invention, the test fixture comprises a vacuum well having a bottom plate and a plurality of bores in the bottom plate in a pattern corresponding to that of the test points on the circuit board. A first plurality of elongated and laterally spaced apart test probes each extend through a first plurality of the bores in the vacuum well and extend a first distance from the top surface of the bottom plate. A second plurality of elongated and laterally spaced apart test probes each extend through a second plurality of bores in the vacuum well and extend a second distance from the top surface of the bottom plate. A stripper plate is disposed above and substantially parallel to the top surface of the bottom plate and has bores in a pattern corresponding to that of the test probes. A top plate holds the circuit board in a testing position above and substantially parallel to the stripper plate so the first plurality of test probes extend through respective bores in the stripper plate and contact the circuit board and so the second plurality of test probes do not contact the circuit board, when the circuit board is in a first position. When the circuit board is in a second position, the top plate holds the circuit board so the first and second plurality of test probes extend through respective bores in the stripper plate and contact the circuit board. An outer gasket contacts the top plate in the first position of the circuit board. A first inner gasket is disposed inside the outer gasket to engage the top plate and form a first vacuum chamber between the bottom plate, the outer gasket, the first inner gasket and the top plate, when the circuit board is in the first position. A second inner gasket is disposed inside the first inner gasket to engage the stripper plate and form a second vacuum chamber between the bottom plate and the stripper plate, within the boundary of the second inner gasket, when the circuit board is in the second position. A source of vacuum is controlled to change the fluid pressure in the first and second vacuum chambers to move the circuit board from the first to the second position.

This fixture does not engage the in-circuit test probes during functional testing. This reduces capacitive loading on the circuit board and minimizes interference from stray signal pick up. The single vacuum well reduces the complexity and the cost of the fixture by decreasing the number of parts required for assembly and the number of drilled holes. As a further improvement, standard test probes can be used, thereby allowing closer spacing between test points.

These and other aspects of the invention will be more fully understood by referring to the following detailed description and the accompanying drawings.

BRIEF DESCRIPTION OF THE DRAWINGS

FIG. 1 is a semi-schematic cross-sectional view of a prior art dual-level test fixture using a single vacuum chamber and a movable stop;

FIG. 3 is a semi-schematic cross-sectional view of 1c dual-level test fixture of this invention shown in a set-up position;

FIG. 4 is a semi-schematic cross-sectional view of the dual-level test fixture of this invention shown in a functional test position; and FIG. 5 is a semi-schematic cross-sectional view of the dual-level test fixture of this invention shown in the in-circuit test position.

DETAILED DESCRIPTION

Prior Art Test Fixture—FIG. 1

Figure 2A:
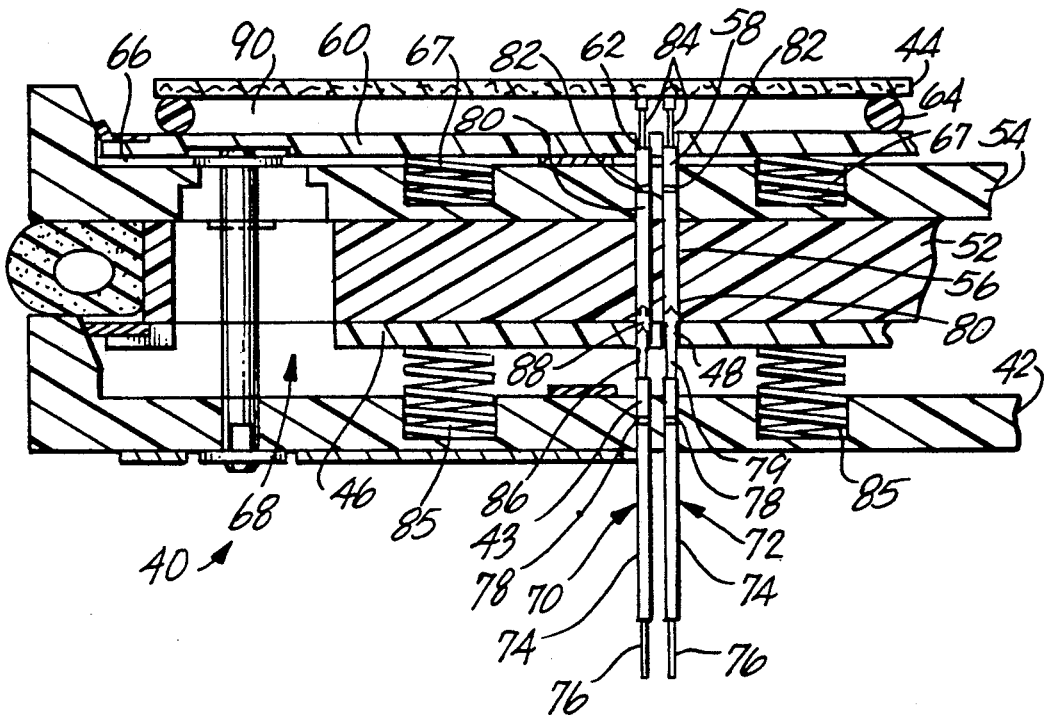
FIGS. 2A and 2B are similar semi-schematic cross-sectional views showing consecutive steps in the use of a prior art dual-level test fixture having two vacuum wells and in-circuit test probes having a gap.

FIG. 1 illustrates by way of example a prior art dual-level test fixture 10 for performing in-circuit and functional tests. The fixture 10 comprises a probe plate 12 having a plurality of bores 14 in a pattern corresponding to that of the test points on a printed circuit board 16. A first plurality of elongated and spaced apart functional test probes 18 each extend through corresponding bores 14 in the probe plate 12 and project a first distance above the top surface of the probe plate 12. A second plurality of elongated and spaced apart in-circuit test probes 20 each extend through a second plurality of bores in the probe plate and project a second distance, which is shorter than the first distance, above the top surface of the probe plate 12. (Only a few of the test probes, which can be several thousand in number, are shown for clarity. Components of the fixture also are shown exaggerated in size or disproportionate in relative size also for clarity.) The first test probes and the second test probes are conventional spring probes having an outer receptacle, an internal compression spring, and a plunger movable against the bias of the spring. The probes in the first and second sets are the same except for their length.

A vacuum chamber seal 22 is disposed on the top surface of the probe plate 12. A moving top plate 24 made of an electrically insulating material is disposed above and substantially parallel to the probe plate 12. The top plate 24 rests on the vacuum chamber seal 22 to form a vacuum chamber 25 enclosed by the probe plate 12, the moving top plate 24 and the vacuum chamber seal 22. The top plate 24 has a plurality of bores 26 aligned vertically with the test probes 13 and 20. The test probes and their respective bores 26 are also in patterns corresponding to the pattern of test points on the circuit board 16. The circuit board 16 is disposed above and substantially parallel to the top plate 24 and rests on a gasket 28 mounted on the top surface of the top plate 24.

During initial test set-up, the top plate 24 is spaced above the tips of the functional test probes 18 so that the functional test probes are not within the bores 26 in the top plate 24. In order to run the functional test, a vacuum is drawn in the vacuum chamber 25 which creates a lower gas pressure inside the vacuum chamber than the atmospheric pressure on the top surface of the circuit board 16. This pressure difference creates a downward force on the circuit board 16 causing the circuit board to move down and compress the gasket 28. The force of the circuit board moving down also moves the top plate 24 down, which compresses the vacuum chamber seal 22. As the circuit board 16 and top plate 24 continue to move down, the functional test probes 18 pass into and move through corresponding bores 26. The top plate continues moving down until it engages a pin 30 which acts as a stop. The pin 30 has a height that allows the functional test probes 18 to project above the top plate 24 and engage corresponding test points on the circuit board 16. Because of their shorter length, the in-circuit test probes 20 are prevented from engaging the test points. Electrical power is applied to the circuit board and functional testing is performed by applying electrical test signals to selected functional test probes communicating the test signals to corresponding test points on the circuit board. This transmits test signals through the circuit board for detection by other functional test probes which send the test signals back to the test analyzer.

After the functional test is completed, power applied to the circuit board 16 is turned off and the vacuum in vacuum chamber 25 is released. As the vacuum is released, the circuit board and the top plate move up, away from the pin 30. The pin 30 is movable laterally from the fixed position shown in FIG. to a second position. After the functional test is completed, the pin 30 is moved laterally to the second position aligned vertically with a clearance hole 32 in the top plate 24. The pin 30 is moved either by a motor or a shuttle plate (not shown). A vacuum is then drawn from vacuum chamber 25, causing the top plate and the circuit board 16 to move down. Functional test probes 18 and in-circuit test probes 20 move into and through the corresponding bores 26 in the top plate 24 while the movable pin 30 moves into the clearance hole 32. Because the movable pin does not inhibit the movement of the circuit board, the circuit board 16 continues moving down until both the functional test probes 18 and the in-circuit test probes 20 project above the top plate 24 and contact respective testing points on the circuit board 16. In-circuit testing is then performed by applying electrical test signals to both the functional test probes and the in-circuit test probes in a manner similar to the functional test described above.

Figure 2B:
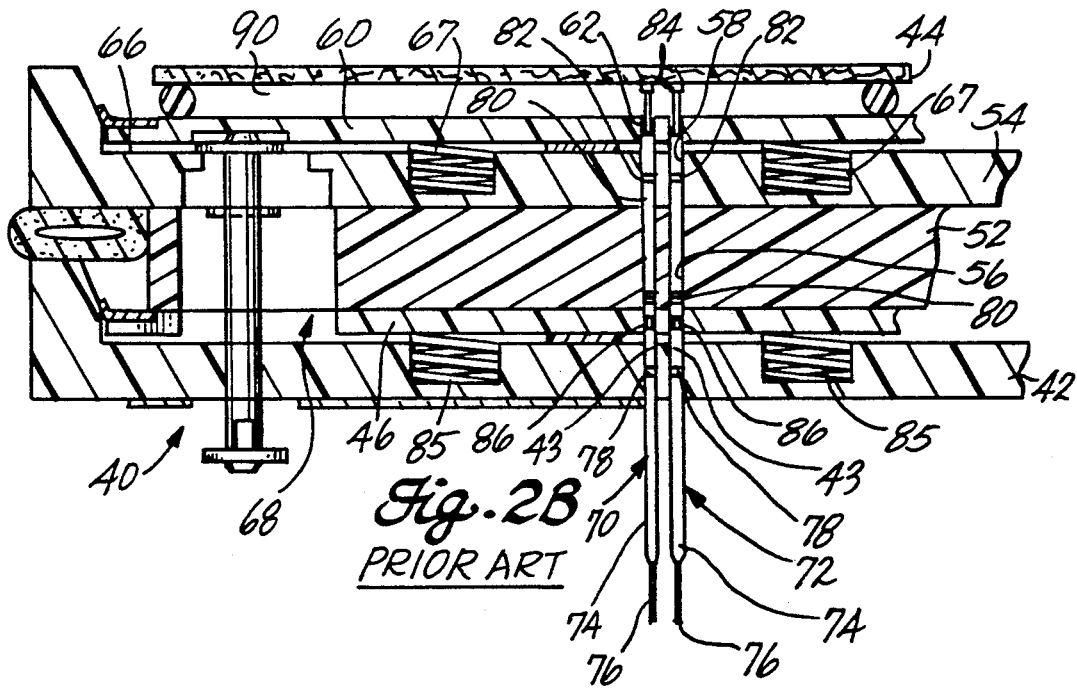

Prior Art Test Fixture—FIGS. 2A-2B

FIGS. 2A and 2B illustrate by way of example a prior art dual-level test fixture 40 for performing functional and in-circuit tests using a two vacuum well system. The test fixture 40 comprises a bottom vacuum well plate 42 having a plurality of bores 43 in a pattern corresponding to that of the test points on a printed circuit board 44. A moving top plate 46 is disposed above and substantially parallel to the bottom vacuum well plate 42. The top plate has a plurality of bores 48 in a pattern aligned vertically with the bores 43 in the bottom plate 42 and with the test points on the printed circuit board 44. An electrically insulating spacer 52 engages the top surface of the moving top plate 46. The spacer 52 comprises a rigid structural plastic foam such as polyvinyl chloride (PVC) structural foam. A top vacuum well plate 54 engages the top surface of the spacer 52. The spacer 52 and the top vacuum well plate 54 each have a plurality of bores 56 and 58, respectively in a pattern corresponding to the pattern of test points on the printed circuit board 44. A moving top plate 60 is disposed above and substantially parallel to the top vacuum well plate 54. The top plate 60 has a plurality of bores 62 in a pattern corresponding to that of the test points on the printed circuit board. A gasket 64 on the top surface of the moving top plate 60 supports the circuit board 44 to form a vacuum chamber 66 comprised of the volumes between the top vacuum well plate 54 and moving top plate 60 and between the moving top plate 60 and the circuit board 44. A vacuum chamber 68 is enclosed by the moving top plate 46 and the bottom vacuum well plate 42.

A first plurality of in-circuit test probes 70 each extend through a first plurality of the bores 43, 48, 56, 58 and 62 in the bottom vacuum well plate 42, the moving top plate 46, the spacer 52, the top vacuum well plate 54 and the moving top plate 60, respectively, projecting above the top surface of the moving top plate 60. A second plurality of functional test probes 72 each similarly extend through a second plurality of bores 43, 48, 56, 58 and 62 in the bottom vacuum well plate 42, the moving top plate 46, the spacer 52, the top vacuum well plate 54 and the moving top plate 60, respectively, projecting above the top surface of the moving top plate 60.

Each functional test probe 72 has a tubular receptacle 74 that is closed at one end and open at the other end. Each receptacle 74 is disposed in the bore 43 in the bottom vacuum well plate 42 so that the open end of the receptacle extends above the top surface of the bottom vacuum well plate while the closed end of the same receptacle extends below the bottom surface of the bottom vacuum well plate 42. A wire-wrapped terminal 76 having a rectangular parallelepiped shape is attached on its smallest face to the closed end of the receptacle 74. Wires (not shown) from the test analyzer are electrically and mechanically connected to the wire-wrap terminals 76 by wire-wrapping techniques well known to those skilled in the art. A crush ring 78 formed by a bulge on the receptacle 74 has a larger diameter than that of the bore 43, so that when the receptacle is inserted into the bore, the crush ring compresses to form a vacuum seal and a mechanical grip for holding the receptacle within the bore. A spring probe 79 disposed in the open end of the receptacle 74 extends into the bore of the moving top plate 46. A second receptacle 80 having a tubular shape is disposed in the contiguous bores 48, 56, 58 and 62 in the moving top plate 46, the spacer 52, the top vacuum well plate 54 and the moving top plate 60, respectively. The end of the second receptacle 80 disposed in the moving top plate 46 is closed and engages the tip of the spring probe 79 when the test fixture 40 is in the initial test set up position. The second receptacle 80 has a crush ring 82 similar in construction to the crush ring 78 and performs a similar function of forming a vacuum seal for the vacuum 66 and holding the receptacle in the top vacuum well plate 54. A spring probe 84 is disposed in the open end of the receptacle 80 to engage the test point on the circuit board 44 during functional and in-circuit testing.

The in-circuit test probe 70 is similar to the functional test probe 72. A receptacle 74 is inserted in a bore 43 in the bottom vacuum well plate 42. A wire-wrapped terminal 76 is attached to the closed end of the receptacle 74 and the open end of the receptacle extends above the top surface of the bottom vacuum well plate 42. A crush ring 78 forms a vacuum seal for the vacuum chamber 68 and holds the receptacle 74 in the bottom vacuum well plate 42. A spring probe 86 is disposed in the open end of the receptacle 74 and extends a shorter distance above the top surface of the bottom vacuum well plate 42 than the distance the probe 79 of the functional test probe 72 extends above the top surface. As with the functional test probes, the in-circuit probe 70 has a receptacle 80 disposed in the bores 48, 56, 58 and 62 of the moving top plate 46, the spacer 52, the top vacuum well 54 and the moving top plate 60, respectively. A crush ring 82 holds the receptacle 80 of the in-circuit probe 70 in place and forms a vacuum seal for the vacuum chamber 66. However, unlike the functional test probe, the spring probe 86 of the in-circuit probe 70 does not engage the closed end of the receptacle 80 during functional test. An internal gap 88 separates the end of in-circuit spring probe 86 and the closed end of its receptacle 80. A spring probe 84 disposed in the open end of the receptacle 80 engages a test point on the circuit board 44 turing both functional and in-circuit testing.

During functional testing, a vacuum is drawn from the vacuum chamber 66 which also draws air from the volume 90 between the circuit board 44 and the gasket 64. As the air is drawn, the atmospheric pressure against the top surface of the circuit board 44 pushes the circuit board down and compresses the gasket 64. This force is transferred to moving top plate 60 which also moves down. Counter-force springs 67 are mounted between the moving top plate 60 and the top vacuum well plate 54 to provide a counter spring force against the downward movement of the moving top plate. As the circuit board 44 moves down, it engages the spring probes 84 or the functional test probes 72 and the in-circuit test probes 70. Electrical test signals are applied to the wire-wrapped test terminals 76 of selected functional test probes 72. The signals are each communicated through the receptacle 74 to the spring probe 79, to the receptacle 80, to the spring probe 84, and to a corresponding test point on the circuit board 44. Test signals travel through selected circuit traces in the printed circuit board which communicate the signals to other test points which send the test signals through other functional test probes 72 and back to the test analyzer.

As shown in FIG. 2B, during in-circuit testing, air is drawn from the vacuum chamber 68. As the air is being withdrawn, the atmospheric pressure against the top surface of the circuit board 44 causes the assembly of the circuit board 44, the moving top plate 60, the top vacuum well plate 54, the spacer 52 and the moving top plate 46 to move down. Counter-force springs 85 mounted between the moving top plate 46 and the bottom vacuum well 42 provide a counter spring force against downward movement of the moving top plate. This downward movement closes the gap 88 between the in-circuit spring probes 86 and the closed end of the receptacle 80 and thereby engages each in-circuit spring probe against each corresponding receptacle 80 to achieve electrical continuity between the in-circuit spring probes and the receptacles. In-circuit testing is now performed by applying electrical signals to both the in-circuit test probes 70 and the functional test probes 72 which communicate test signals through the in-circuit probes and the circuit board in a manner similar to that described above for functional testing.

The Invention

FIGS. 3-5 illustrate a circuit board tester according to principles of this invention. The test fixture 100 comprises a vacuum well 102 having a bottom plate 104 and a plurality of bores 106 in the bottom plate in a pattern corresponding to that of the test points on a printed circuit board 108. The bottom plate 104 is made of a sturdy, rigid electrical insulating material, such as G-10 fiberglass. A first plurality of elongated and laterally spaced apart functional test probes 110 each extend through a first group of the bores 106 in the bottom plate 104 and project a first distance above the top surface of the bottom plate 104. A second plurality of elongated and laterally spaced apart in-circuit test probes 112 each extend through a second group of the bores 106 in the bottom plate 104 and project a second distance, which is shorter than the first distance, above the top surface of the bottom plate 104. Various types of test probes can be used for the functional test probes 110 and the in-circuit test probes 112. A typical test probe is, for example, part number HPA-25 or part number LTP-25 manufactured by Everett/Charles Contact Products, Inc., the assignee of this application.

A rectangular outer gasket 114 contacts the sidewall of the bottom plate 104. Various materials, such as urethane elastomers, may be used for the outer gasket 114 and are well known to those skilled in the art. A compressible upright first inner gasket 116 is mounted to the top surface of the bottom plate 104 under the outer gasket 114. When the fixture is viewed in its set up position of FIG. 3, the first inner gasket 116 divides the vacuum well 102 into two vacuum chambers, an annular outer chamber 118 and an inner or central chamber 120. The annular outer chamber 118 is formed between the bottom plate 104 and a moving top plate 124 (described below) contacted by the first inner gasket 116. The outer chamber is sealed on the outside by the outer gasket 114 and on the inside by the first inner gasket 116. A compressible upright second inner gasket 122 is mounted on the top surface of the vacuum well 102 inside the first inner gasket 116. The gaskets 114, 116 and 122 are of continuous closed geometric forms, preferably rectangular in shape, and are aligned on a common vertical axis so the sides of the rectangles are parallel to each other and symmetrically spaced from one another. The annular outer vacuum chamber 118 extends around the outer periphery of the first inner gasket 116, and the rectangular inner chamber 120 (shown in FIG. 3) is centrally disposed within the first inner gasket 116, surrounding the array of test probes 110 and 112. Both inner gaskets 116 and 122 are made of an elastomeric material such as Puron, a urethane rubber familiar to those skilled in the art.

A moving top plate 124 having a rectangular annular shape is mounted above and substantially parallel to the vacuum well bottom plate 104. The outer edge of the moving top plate 124 mounts the outer gasket 114, and the first inner gasket 116 contacts the bottom of the top plate 124 to form the annular outer vacuum chamber 118 between the outer gasket 114 and the first inner gasket.

A counterforce spring 126 is disposed in a recess on the vacuum well bottom plate 104 and contacts the bottom of the moving top plate 124 to provide a counter spring force against downward motion of the moving top plate. A stripper plate 128 is mounted in a central portion of the moving top plate 124 which holds the stripper plate above and substantially parallel to the vacuum well 102. This stripper plate is made of a sturdy, rigid electrical insulating material such as G-10 fiberglass. The printed circuit board 108 is mounted on a rectangular gasket 130 affixed to the upper surface of the stripper plate 128. The second inner gasket 122 is mounted to the bottom plate below the periphery of the stripper plate. The stripper plate is movable downwardly to contact the second inner gasket 122. The stripper plate 128 is movable down along a guide pin 132 mounted in a hole 124 at the periphery of the stripper plate 128. The guide pin 132 is disposed in a return spring 136 having an end that engages the vacuum well 102 and an opposite end that engages the stripper plate 128. The return spring provides a counter spring force against downward movement of the stripper plate 128.

A mechanical hold-down gate 138 applies a counterforce against the printed circuit board 108 and provides a means for latching the stripper plate 128 to the moving top plate 124 during a first step in the testing procedure described below. The hold down gate includes a plurality of longitudinally spaced apart tracks 140 retained by a pair of parallel brackets 142 extending along opposite edges of the plate. The tracks 140 are spaced apart along the length of the brackets. The opposite ends of each track engage notches 146 in each of the brackets 142. The tracks 140 can be moved longitudinally within the notches 146 and are held in a desired location by set screws 148 in corresponding holes 150 at opposite ends of the tracks 140 Within each track 140 there are a plurality of fingers 154 that can move along the length of the track. (The size of and the number of test points on the circuit board determine the number of fingers within a single track that will be within each track. For clarity, only two fingers are shown.) Each finger has a rigid pin that contacts the top of the printed circuit board 108. Adjustment nuts 152 control the amount of hold-down force applied by the fingers to the top of the board. The construction and use of the tracks 140 and the fingers 154 are well known to those skilled in the art. The locations of the tracks 140 and the fingers 154 within the track are unique for each printed circuit board 108 and are determined based on the location of the test probes against the printed circuit board. A latch 156 latches to a post 158 affixed to the moving top plate 124 to hold the mechanical hold-down gate 138 against the moving top plate 124. The latch also causes the fingers 152 of the mechanical hold-down gate to be moved into contact with the printed circuit board 108 to hold the moving top plate 124 and the stripper plate 128 together as a unit.

During initial test set up shown in FIG. 3, the printed circuit board 108 is placed on the gasket 130 and the mechanical hold-down gate 138 is placed against the movable annular top plate 124 so the fingers 154 rest against the top of the printed circuit board 108. The latch 156 is rotated to engage the post 158 to hold the mechanical hold-down gate against the moving top plate 124. The stripper plate 128 is connected mechanically to the top plate 124 when the latch is activated. In this initial set up position, there is a gap 160 between the bottom of the printed circuit board 108 and the tips of the functional test probes 110 The in-circuit test probes 112 also are out of contact with the board. Because the gap 160 prevents electrical continuity between the printed circuit board and the functional test probes 110, a calibration procedure can be run that calibrates and verifies the test fixture prior to electrical test.

In order to run the functional test, a vacuum is drawn from the annular outer vacuum chamber 118. A vacuum source 161 shown in FIG. 4 changes fluid pressure in the vacuum chamber 118. As shown in FIG. 4, air withdrawn from the annular outer vacuum chamber 118 below the movable top plate 124 causes atmospheric pressure against the top surface of the moving top plate 124 to apply a force to this top surface, causing the top plate to move down toward the probes. Since the stripper plate 128 is latched to the moving top plate, the stripper plate and the circuit board move down in unison with the moving top plate. This downward travel of the outer top plate compresses the first inner gasket 116 which seals off the annular outer chamber 118 from the central chamber 120 below the stripper plate. Under this downward travel, the functional test probes 110 apply a spring force against corresponding test points on the printed circuit board. The top plate moves down until engaging a fixed first stop 162 disposed in the vacuum chamber 118 on the top surface of the vacuum well 102. The second inner gasket 122 also is compressed by the stripper plate as the top plate and the stripper plate move downwardly to the first stop. Under the control of the first stop, the functional test probes contact the board but the tips of the in-circuit test probes are still out of contact with the board. During functional tests, the test analyzer applies electrical test signals to selected test points on the printed circuit board via the functional test probes 110 only. Signals are sent through the circuit board 108 to other test points for detection by other functional test probes 110 for sending the test signals back to the test analyzer.

As shown in FIG. 5, during in-circuit test a further vacuum is drawn from the central vacuum chamber 120 formed beneath the stripper plate by its contact with the second inner gasket 122. A vacuum source 163 shown in FIG. 4 changes fluid pressure in the vacuum chamber 120. The vacuum drawn from the chamber 120 causes the atmospheric pressure against the top surface of the printed circuit board 108 to move the printed circuit board 108 and the stripper plate 128 down, thereby engaging the board with the tips of the in-circuit test probes 112. The downward movement of the printed circuit board 108 is away from the fingers 154 on the hold down gate, which forms a gap 161 between the fingers and the board. The stripper plate 128 continues to move downward separate from the annular outer top plate 124, which does not move during the in-circuit test cycle. The force from the atmospheric pressure on the circuit board is sufficient to counter the spring force from the probes. The printed circuit board 108 continues downward travel until engaging a second stop 164 spaced below the level of the first stop 162 for the outer top plate 124. The second stop 164 is located in the central vacuum chamber 120. In the position of the fixture shown in FIG. 5, in which the central vacuum chamber 120 has been evacuated, both sets of test probes 110 and 112 make contact with the test points on the board. The second inner gasket 122 is squeezed further and the central vacuum chamber 120 is drawn down in size and continues to be sealed from the annular outer chamber 118 by the second inner gasket 122. During the in-circuit test cycle, the test analyzer applies electrical test signals tr selected in-circuit test probes 112 and functional test probes 110. The probes 110 and 112 communicate the signals to some of the test points on the printed circuit board 108 to send the signals through the circuit board for detection by other in-circuit and functional test probes which then send the test signals back to the test analyzer.

By using two vacuum chambers, the test fixture can be cycled between functional test and in-circuit test without releasing the vacuum or turning off power. This reduces test time and thus test cost. Furthermore, failures that occur during functional test are more likely to occur during in-circuit test because the circuitry on the circuit board is not recycled by a power shut down and start-up.

A single vacuum well fixture requires a single set of probe holes in the well plate. The probes require only one crush ring for sealing the vacuum chamber and holding the probe within the well. Thus, standard test probes can be used.

The two levels of test probes improve test reliability by reducing the capacitive loading and antenna pickup from test probes. Because only test probes that are being used contact the circuit board, the unused test probes do not introduce additional electrical impedances or signals to the circuits.

What is claimed is:

1. Apparatus for testing a circuit board having a plurality of spaced apart test points, the apparatus comprising:

a vacuum well having a bottom plate and a plurality of bores in a bottom plate in a pattern corresponding to that of the test points on the printed circuit board;

a first plurality of elongated and spaced apart test probes each extending through a first plurality of bores in the vacuum well and extending a first distance from the top surface of the bottom plate;

a second plurality of elongated and spaced apart test probes each extending through a second plurality of bores in the vacuum well and extending a second distance from the top surface of the bottom plate;

a stripper plate disposed above and substantially parallel to the top surface of the bottom plate, the stripper plate having bores in a pattern corresponding to that of the test probes;

means for holding the circuit board in a testing position above and substantially parallel to the stripper plate so the first plurality of test probes extend through respective bores in the stripper plate and contact the circuit board and so the second plurality of test probes do not contact the circuit board, when the circuit board is in a first position, and so the first and second plurality of test probes extend through respective bores in the stripper plate and contact the circuit board when the circuit board is in a second position;

a movable top plate for moving the stripper plate and the circuit board to the first position;

an outer gasket contacting the movable top plate in said first position of the stripper plate and the circuit board;

a first inner gasket disposed inside the outer gasket to engage the top plate and form a first vacuum chamber between the bottom plate, the outer gasket, the first inner gasket, and the top plate when the circuit board is in the first position;

a second inner gasket disposed inside the first inner gasket to engage the stripper plate and form a second vacuum chamber between the bottom plate and the stripper plate, within the boundary of the second inner gasket, when the circuit board is in the second position; and means for applying fluid pressure to the first vacuum chamber to maintain the stripper plate and the circuit board in the first position, and means for applying a fluid pressure to the second vacuum chamber to cause the stripper plate and the circuit board to move from the first to the second position.

2. Apparatus according to claim 1, in which electrical test signals are applied to the first plurality of test probes and the test signals are detected for conducting a functional test, and electrical test signals are applied to the second plurality of test probes and the test signals are detected for conducting in-circuit testing.

3. Apparatus according to claim 1, including a first fixed stop in the first vacuum chamber for engaging the top plate to hold the circuit board in the first position, and a second fixed stop in the second vacuum chamber at a level spaced from the level of the first stop for engaging the stripper plate to hold the circuit board in the second position.

4. Apparatus for testing a circuit board having a plurality of spaced apart test points, the apparatus comprising:

a vacuum well having a bottom plate and a plurality of bores in a bottom plate in a pattern corresponding to that of the test points on the printed circuit board;

a first plurality of elongated and spaced apart test probes each extending through a first plurality of bores in the vacuum well and extending a first distance from the top surface of the bottom plate;

a second plurality of elongated and spaced apart test probes each extending through a second plurality of bores in the vacuum well and extending a second distance from the top surface of the bottom plate;

a stripper plate disposed above and substantially parallel to the top surface of the bottom plate, the stripper plate having bores in a pattern corresponding to that of the test probes;

a hold down gate for holding the circuit board in a testing position above and substantially parallel to the stripper plate so the first plurality of test probes extend through respective bores in the stripper plate and contact the circuit board and so the second plurality of test probes do not contact the circuit board when the circuit board is in a first position, and so the first and second plurality of test probes extend through respective bores in the stripper plate and contact the circuit board when the circuit board is in a second position;

a movable top plate for moving the stripper plate and the circuit board to the first position;

an outer gasket contacting the movable top plate in said first position of the circuit board;

a first inner gasket disposed inside the outer gasket to engage the top plate and form a first vacuum chamber between the bottom plate, the outer gasket, the first inner gasket, and the top plate when the circuit board is in the first position;

a second inner gasket disposed inside the first inner gasket to engage the stripper plate and form a second vacuum chamber between the bottom plate and the stripper plate, within the boundary of the second inner gasket, when the circuit board is in the second position; and a vacuum source for changing the fluid pressure in the first and second vacuum chambers to cause the stripper plate and the circuit board to move from the first to the second position.

5. Apparatus according to claim 4, including a first fixed stop in the first vacuum chamber for engaging the top plate to hold the circuit board in the first position, and a second fixed stop in the second vacuum chamber at a level spaced from the level of the first stop for engaging the stripper plate to hold the circuit board in the second position.

6. Apparatus for testing a circuit board having a plurality of spaced apart test points, the apparatus comprising:

a vacuum well having a bottom plate and a plurality of bores in a bottom plate in a pattern corresponding to that of the test points on the printed circuit board;

a first plurality of elongated and spaced apart test probes each extending through a first plurality of bores in the vacuum well and extending a first distance from the top surface of the bottom plate;

a second plurality of elongated and spaced apart test probes each extending through a second plurality of bores in the vacuum well and extending a second distance from the top surface of the bottom plate;

a stripper plate disposed above and substantially parallel to the top surface of the bottom plate, the stripper plate having bores in a pattern corresponding to that of the test probes;

means for holding the circuit board in a testing position above and substantially parallel to the stripper plate so the first plurality of test probes extend through respective bores in the stripper plate and contact the circuit board and so the second plurality of test probes do not contact the circuit board when the circuit board is in a first position, and so the first and second plurality of test probes extend through respective bores in the stripper plate and contact the circuit board when the circuit board is in a second position, the first and second plurality of test probes being spaced from contact with the circuit board when the circuit board is in a third position;

a movable top plate for moving the stripper plate and the circuit board in unison between the first and second position;

an outer gasket contacting the movable to plate in said first and second positions of the circuit board;

a first inner gasket disposed inside the outer gasket to engage the top plate and form a first vacuum chamber between the bottom plate, the outer gasket, the first inner gasket, and the top plate when the circuit board is in the first position;

a second inner gasket disposed inside the first inner gasket to engage the stripper plate and form a second vacuum chamber between the bottom plate and the stripper plate, within the boundary of the second inner gasket, when the circuit board is in the second position; and means for applying a fluid pressure to the first vacuum chamber to cause the stripper plate and the circuit board to move between the first and the second positions, and means for applying a fluid pressure to the second vacuum chamber to cause the stripper plate and the circuit board to move from the second to the third positions.

7. Apparatus according to claim 6, including a first fixed stop in the first vacuum chamber for engaging the top plate to hold the circuit board in the first position, and a second fixed stop in the second vacuum chamber at a level spaced from the level of the first stop for engaging the stripper plate to hold the circuit board in the second position.

8. A process for performing electrical testing of a printed circuit board in a test fixture electrically connected to an electronic circuit tester for performing high speed testing of circuits on the board, the process comprising:

mounting a printed circuit board in a fixed position on a movable support disposed in the test fixture, the support having a first portion and a second portion;

positioning a first array of test probes adjacent the support for contact with a first set of test points on the printed circuit board;

positioning a second array of test probes adjacent the support for contact with a second set of test points on the printed circuit board, the second array of probes having ends spaced from the ends of the first array of probes;

applying a first vacuum to the first portion of the support to move the first and second portions of the support and the circuit board in unison toward the probes to produce contact between the first test probes and the first set of test points on the board;

communicating electrical test signals from the first array of test probes to the electronic circuit tester when the first vacuum is applied;

applying a second vacuum to the second portion of the support to move the board and the second portion of the support independently of the first portion of the support toward the probes to produce contact between the second test probes and the second set of test points of the board; and communicating electrical test signals from at least the second array of test probes to the electronic circuit tester when the second vacuum is being applied.

9. The process according to claim 8, in which the top plate engages a first fixed stop in the first vacuum chamber to hold the circuit board in the first portion, and engaging a second fixed stop in the second vacuum chamber at a level spaced from the level of the top plate to hold the circuit board in the second position.

10. The process according to claim 8 including conducting a functional test with the first array of probes and conducting an in-circuit test with the second array of probes.

11. A dual-level test fixture for testing a circuit board comprising:

a movable support plate for supporting a printed circuit board under test;

a probe plate spaced below the support plate, the probe plate mounting a first set of test probes and a second set of test probes, the first and second sets of probes extending generally perpendicular to the board under test for contacting corresponding test points on the board, the first set of test probes extending to a first level above the probe plate and the second set of test probes extending to a second level above the probe plate spaced from the first level;

a movable top plate disposed around an outer boundary of the movable support plate;

means for moving the top plate and the support plate in unison;

means for forming a first vacuum chamber adjacent the top plate so that air withdrawn from the first chamber draws the top plate and the support in unison toward the test probes and to said first level so the first set of probes contact corresponding test points on the board while the second set of probes remain out of contact with the board; and means for forming a second vacuum chamber adjacent the support plate and isolated from the first chamber so that air withdrawn from the second chamber moves the support plate independently of the top plate to the second level so the second set of probes contact corresponding test points on the board.

12. Apparatus according to claim 11 in which the first set of probes remain in contact with the board during evacuation of the second vacuum chamber.

13. Apparatus according to claim 11 in which the first set of probes are functional test probes and the second set of probes are in-circuit test probes.

14. Apparatus according to claim 11 including a hold-down means affixed to the top plate and releasably engaged with the support plate to move the support plate with the top plate when the first chamber is evacuated, the support plate being released from the hold-down means when the second chamber is evacuated.

15. Apparatus according to claim 11 including a first fixed stop in the first vacuum chamber for engaging the top plate to hold the circuit board at the first level, and a second fixed stop in the second vacuum chamber spaced from the first stop for engaging the support plate to hold the circuit board at the second level.

* * * * *

UNITED STATES PATENT AND TRADEMARK OFFICE
CERTIFICATE OF CORRECTION

PATENT NO. : 5,214,374
DATED : May 25, 1993
INVENTOR(S) : Gary F. St. Onge

It is certified that error appears in the above-indentified patent and that said Letters Patent is hereby corrected as shown below:

On the title page:

Abstract, line 8, before "array" change "ar" to -- an --.

Column 1, line 25, after "checking" delete "it".

Column 2, line 18, before "created" insert -- is --.
Column 2, line 29, after "during" change "ir" to -- in --.

Column 3, line 60, after "view of" change "1c" to -- the --.

Column 4, line 36, after "probes" change "13" to -- 18 --.

Column 5, line 9, after "FIG." insert -- 1 --.

Column 6, line 67, change "turing" to -- during --.

Column 8, line 55, change "124" to -- 134 --.

Column 9, line 6, after "140" insert a period.
Column 9, line 39, after "110" insert a period.

Column 10, line 9, after "during" insert -- an --.
Column 10, line 41, after "signals" change "tr" to -- to --.

UNITED STATES PATENT AND TRADEMARK OFFICE
CERTIFICATE OF CORRECTION

PATENT NO. : 5,214,374
DATED : May 25, 1993
INVENTOR(S) : Gary F. St. Onge

It is certified that error appears in the above-indentified patent and that said Letters Patent is hereby corrected as shown below:

Column 13, line 21, after "movable" change "to" to -- top --.

Signed and Sealed this

Eighth Day of March, 1994

Attest:

BRUCE LEHMAN

Attesting Officer

Commissioner of Patents and Trademarks